US 8,508,941 B2

(12) United States Patent
Simon et al.

(10) Patent No.: US 8,508,941 B2
(45) Date of Patent: Aug. 13, 2013

(54) FAN ASSEMBLY WITH FLEX PRINTED CIRCUIT BOARD (75) Inventors: Glenn C Simon, Auburn, CA (US); Teri F Verschoor, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 13/172,982

(22) Filed: Jun. 30, 2011

(65) Prior Publication Data

US 2013/0003298 A1 Jan. 3, 2013

(51) Int. Cl.
*H05K 7/20* (2006.01)

(52) U.S. Cl.
USPC ............... 361/695; 361/679.48; 361/679.49; 361/679.5; 361/692; 165/80.3; 165/104.33; 165/121; 165/122; 454/184

(58) Field of Classification Search
USPC ...... 361/679.46–679.51, 690–697; 165/80.3, 165/104.33, 121–126, 185; 454/184; 415/60, 415/61, 119, 126, 213.1, 214.1, 121.2, 220, 415/186, 208.1, 209, 211.2, 216.1; 416/144 R, 416/247 R, 244 R, 69, 70 R; 417/423.14, 417/423.15
See application file for complete search history.

(56) References Cited

U.S. PATENT DOCUMENTS

| | | | | |
|---|---|---|---|---|
| 5,287,244 A * | 2/1994 | Hileman et al. | ......... | 361/679.47 |
| 6,603,661 B2 * | 8/2003 | Smith et al. | .................. | 361/695 |
| 6,625,033 B1 * | 9/2003 | Steinman | ...................... | 361/753 |
| 6,808,411 B2 * | 10/2004 | Chen | ............................. | 439/485 |
| 6,851,925 B2 * | 2/2005 | Chuang | ......................... | 415/126 |
| 6,921,247 B2 | 7/2005 | Stewart et al. | | |
| 7,054,155 B1 | 5/2006 | Mease et al. | | |
| 7,218,515 B2 * | 5/2007 | Vinson et al. | ............ | 361/679.48 |
| 7,236,361 B2 * | 6/2007 | Cote et al. | ...................... | 361/695 |
| 7,379,300 B1 * | 5/2008 | Chen | ............................. | 361/695 |
| 7,445,430 B2 * | 11/2008 | Kao et al. | ................... | 415/213.1 |
| 7,481,704 B2 * | 1/2009 | Kao et al. | ...................... | 454/184 |
| 7,511,955 B2 * | 3/2009 | Yin | ................................ | 361/695 |
| 7,522,415 B2 * | 4/2009 | Fan et al. | ...................... | 361/695 |
| 7,537,480 B2 * | 5/2009 | Li | ................................. | 439/485 |
| 7,699,582 B2 * | 4/2010 | Tao | ............................... | 415/213.1 |
| 7,701,713 B2 * | 4/2010 | Li | ................................. | 361/695 |

(Continued)

FOREIGN PATENT DOCUMENTS

KR 20070067396 6/2007

*Primary Examiner* — Michail V Datskovskiy (57) ABSTRACT

A fan assembly includes a housing; a plurality of fan units mounted in the housing; and a flex printed circuit board (PCB) having a first portion, the first portion of the flex PCB electrically connected to each of the plurality of fan units, the flex PCB having a second portion, the second portion of the flex PCB including a printed circuit assembly (PCA), the PCA having mounted thereon a connector to connect to a PCA disposed within a chassis. Alternatively, an apparatus includes a chassis having a PCA disposed inside the chassis; and a fan assembly, the fan assembly including a housing; a plurality of fan units mounted in the housing; and a flex PCB having a first portion, the first portion of the flex PCB being arranged parallel to a surface of the housing and being electrically connected to each of the plurality of fan units, the flex PCB having a second portion, the second portion of the flex PCB including a PCA, the PCA having mounted thereon a connector connected to the PCA disposed within the chassis.

20 Claims, 5 Drawing Sheets

(56) References Cited

U.S. PATENT DOCUMENTS

| | | |
|---|---|---|
| 7,729,116 B1 | 6/2010 | Aybay et al. |
| 7,907,404 B2 * | 3/2011 | Wu et al. .................. 361/695 |
| 8,075,248 B2 * | 12/2011 | Yin et al. .................. 415/60 |
| 8,246,301 B2 * | 8/2012 | Li ........................ 415/213.1 |
| 8,279,596 B2 * | 10/2012 | Rodriguez et al. ....... 361/679.48 |
| 8,373,989 B2 * | 2/2013 | Gong et al. ................ 361/695 |
| 2006/0256522 A1 | 11/2006 | Wei et al. |
| 2007/0153477 A1 * | 7/2007 | Liang ....................... 361/695 |
| 2011/0290456 A1 * | 12/2011 | Huang et al. ............. 165/121 |

* cited by examiner

FAN ASSEMBLY WITH FLEX PRINTED CIRCUIT BOARD

BACKGROUND

Electronic devices, for example, computing devices, networking devices, switches, routers, etc., may utilize one or more fans to draw cool air from outside the electronic device into the electronic device. The air may be directed along an air flow path across electronic components within the electronic device to cool the electronic components and directed out of the electronic device.

DETAILED DESCRIPTION

Electronic devices, for example, computing devices, networking devices, switches, routers, etc., may utilize a fan assembly to draw cool air from outside the electronic device into the electronic device. The air may be directed along an air flow path across electronic components within the electronic device to cool the electronic components and directed out of the electronic device. As more electrical components are included in electronic devices to increase processing of data, the space allotted to the fan assembly may be maximized to cool the electrical components.

A fan assembly is provided that includes a housing; a plurality of fan units mounted in the housing; and a flex printed circuit board (PCB). The flex PCB may include a first portion that is electrically connected to each of the plurality of fan units. The flex PCB may include a second portion having a printed circuit assembly (PCA). The PCA may have mounted thereon a connector to connect to another PCA disposed within a chassis of an electronic device.

Figure 1:
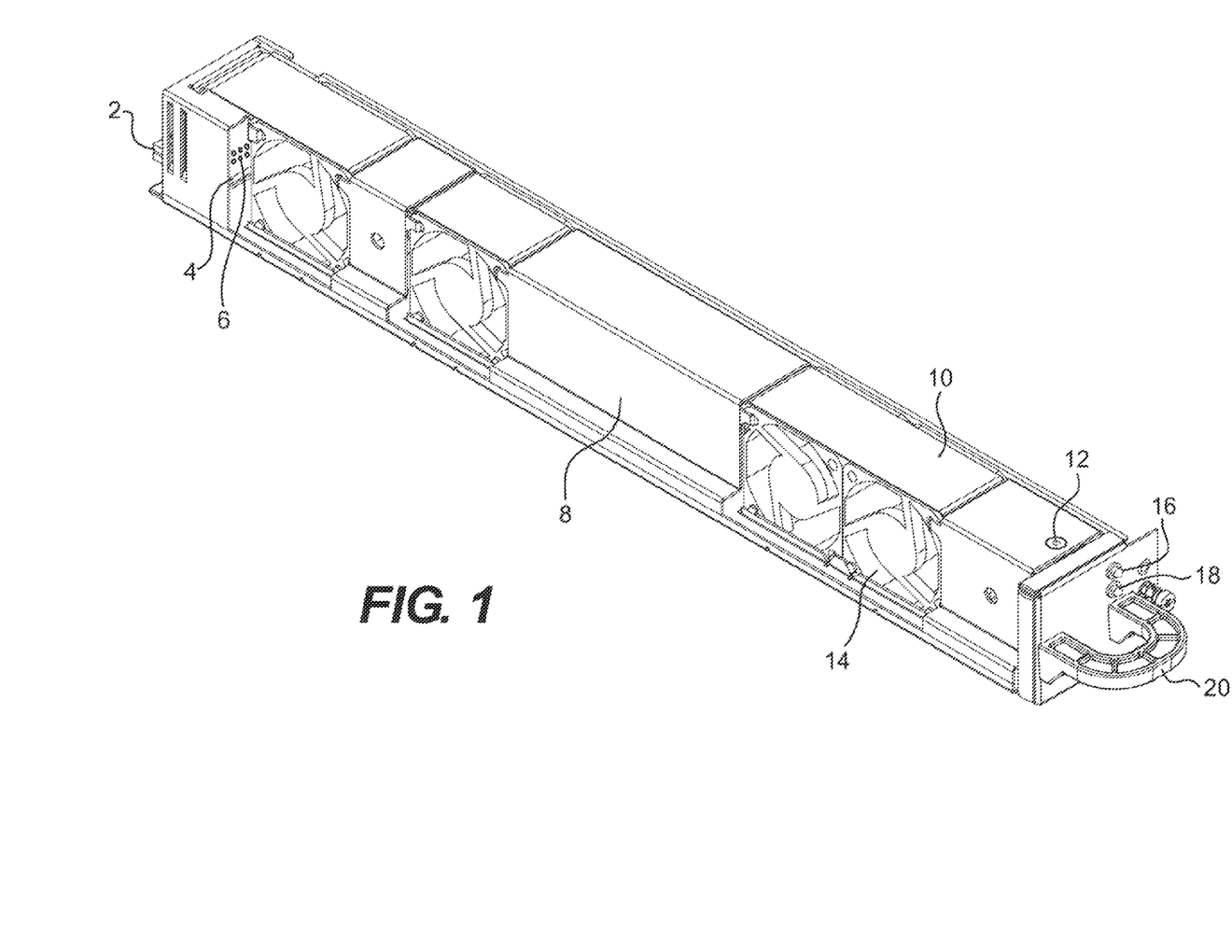
FIG. 1 is a side perspective view of an example of a fan assembly, according to at least one embodiment of the present disclosure.
Figure 2:
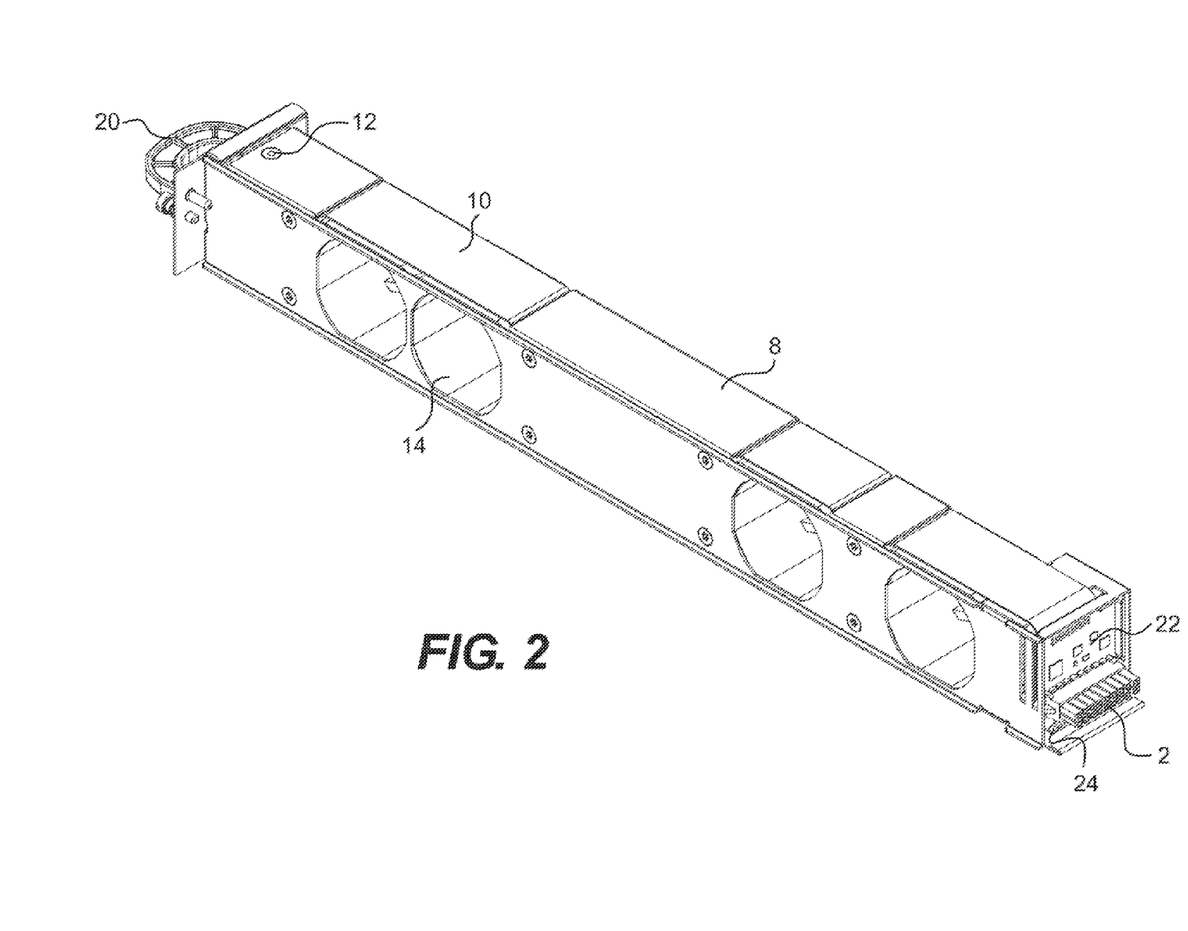
FIG. 2 is a side perspective view of an example of a fan assembly, according to at least one embodiment of the present disclosure.

FIGS. 1 and 2 depict proximal and distal side perspective views of an example of a fan assembly. As shown in FIGS. 1 and 2, the fan assembly includes a housing 8, and a plurality of fan units 14. Each of the plurality of fan units 14 may be slidably mounted within housing 8 and may be oriented such that, when operating, the fans direct air in the same direction. While four fans are depicted in the figures, it may be appreciated that more or less than four fan units may be mounted within the fan assembly. The fans may be implemented as identical fan units, for example, 40 mm fan units, etc. Alternatively, the fan units may be implemented as different types of fan units. The housing may be made of steel sheet metal or other suitable material, and may further include retainers that retain the fan units within the housing.

The fan assembly may further include a flex PCB that has a first portion 10 arranged parallel to a surface of the house. As shown in FIG. 1, the flex PCB is arranged along the top surface of the housing. As shown in FIG. 1, a portion of the flex PCB is arranged outside the housing and a portion of the flex PCB is arranged inside the housing. By providing the flex PCB in this manner, there may be no need to affix the flex PCB to the housing. Alternatively, the first portion of the flex PCB may be arranged outside the housing and may be adhered, using a suitable adhesive or other suitable affixing methods, to the housing in order to avoid shifting of flex PCB during insertion of the fan assembly into a chassis of an electronic device. The first portion of the flex PCB may provide an electrical connection to each of the fan units as discussed more fully below.

The flex PCB may have a second portion 22 including a PCA. The PCA may be arranged orthogonal to the first portion of the flex PCB. The PCA may be moveable restricted within a retainer portion 24 of the housing as may be more fully discussed below. The PCA may include a connector 2, for example, a blind mate connector, etc., for engaging with a corresponding connector arranged on a main PCA of the chassis of the electronic device, as more fully discussed below. PCA may further include additional electrical components for managing operation of the fan units. For example, PCA may include a controller for controlling operation of each of the fan units in the fan assembly.

The flex PCB may be implemented as, for example, a flex product as manufactured by Molex TM. The first portion of the flex PCB may be implemented as, for example, a single layer or multilayer, copper PCB, a single-sided flex product, etc. The second portion of the flex PCB may be implemented as, for example, a rigid flex product. It may be appreciated that other products may be utilized that appreciate similar functionality as discussed herein.

The fan assembly may further include indicators 16 and 18. Indicators 16 and 18 may be implemented as, for example, light emitting diode indicators and may provide information about the operation of the fan assembly, fan units within the assembly, or other components within the assembly. Indicators 16 and 18 may be electrically connected to the flex PCB as may be more fully discussed below.

The fan assembly may further include handle 20 that may be used to facilitate insertion and removal of the fan assembly into and out of a chassis of an electronic device. It may be appreciated that fan assembly may be utilized with any type of electronic device that requires cooling of electronic components, for example computing devices, networking devices, switches, routers, etc.

The fan assembly may be implemented as a hot-swappable fan assembly whereby the fan assembly may be removed from the electronic device and a new fan assembly may be inserted into the electronic device without interruption of the function of one or more electronic components within the electronic device. Alternatively, the fan assembly may be implemented where the housing of the fan assembly is easily removed in order to gain access to failed components of the fan assembly, for example a failed fan unit.

The housing of the fan assembly may be assembled using one or more self-threading screws 12, for example, where the fan assembly is a hot-swappable fan assembly. It may be appreciated that other methods and materials may be used for assembling the housing, for example, rivets, screws, etc. Alternatively, where the fan assembly may be repairable, the housing may be constructed using components that snap together in order to facilitate easy access to the fan units for replacement.

Figure 3:
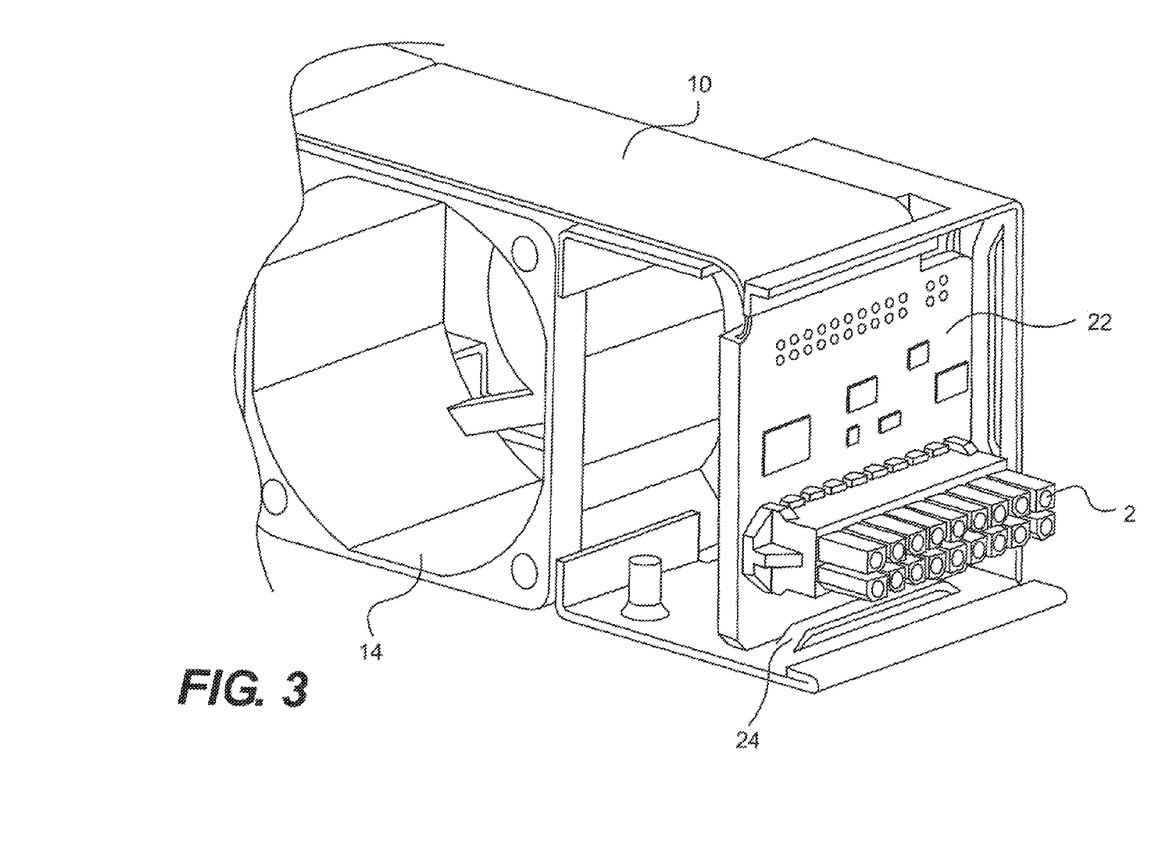
FIG. 3 is a side perspective view of one end of an example of a fan assembly, according to at least one embodiment of the present disclosure.

FIG. 3 is a side perspective view of one end of an example of a fan assembly. As shown in FIG. 3, the first portion of the flex PCB 10 is arranged along the top surface of the fan assembly while the second portion of the flex PCB 22 is orthogonal to the first portion of the flex PCB. The second portion of the flex PCB is movable in a vertical direction such that when the fan assembly is inserted into a chassis, the second portion may move vertically and horizontally to adjust position of the second portion with respect to the housing in order to mate with the corresponding connector located on the main PCA within the chassis of the electronic device.

For example, the second portion of the flex PCB may be retained in position by retainer portion 24. Retainer portion may be implemented as, for example, tabs extended from a surface of the housing to prevent horizontal movement of the PCA of the second portion of the flex PCB. One tab 24 is depicted in FIG. 3. A second corresponding tab 24 (not shown in FIG. 3) may extend from the surface of the housing such that the PCA sits between the two tabs 24. This permits movement of the PCA in the vertical direction and horizontal directions and prevents movement of the PCA forward or backward within the housing. Thus, the PCA may move in the vertical and horizontal directions as needed to mate with the corresponding connector mounted on the main PCA inside the chassis. The connection between the fan assembly and the electronic device is discussed below with regard to FIG. 5. The retainer portion 24 provides support for the PCA such that when the fan assembly is inserted, the tabs prevent movement of the PCA in the forward or backward direction thereby permitting the connector of the PCA of the second portion of the flex PCB to engage the corresponding connector mounted on the main PCA inside the chassis. As the connector mounted on the PCA of the second portion of the flex PCB is at a distal end of the fan assembly where the handle is located, the connection to the corresponding connector mounted on the main PCA may be a blind mate connection.

Figure 4:
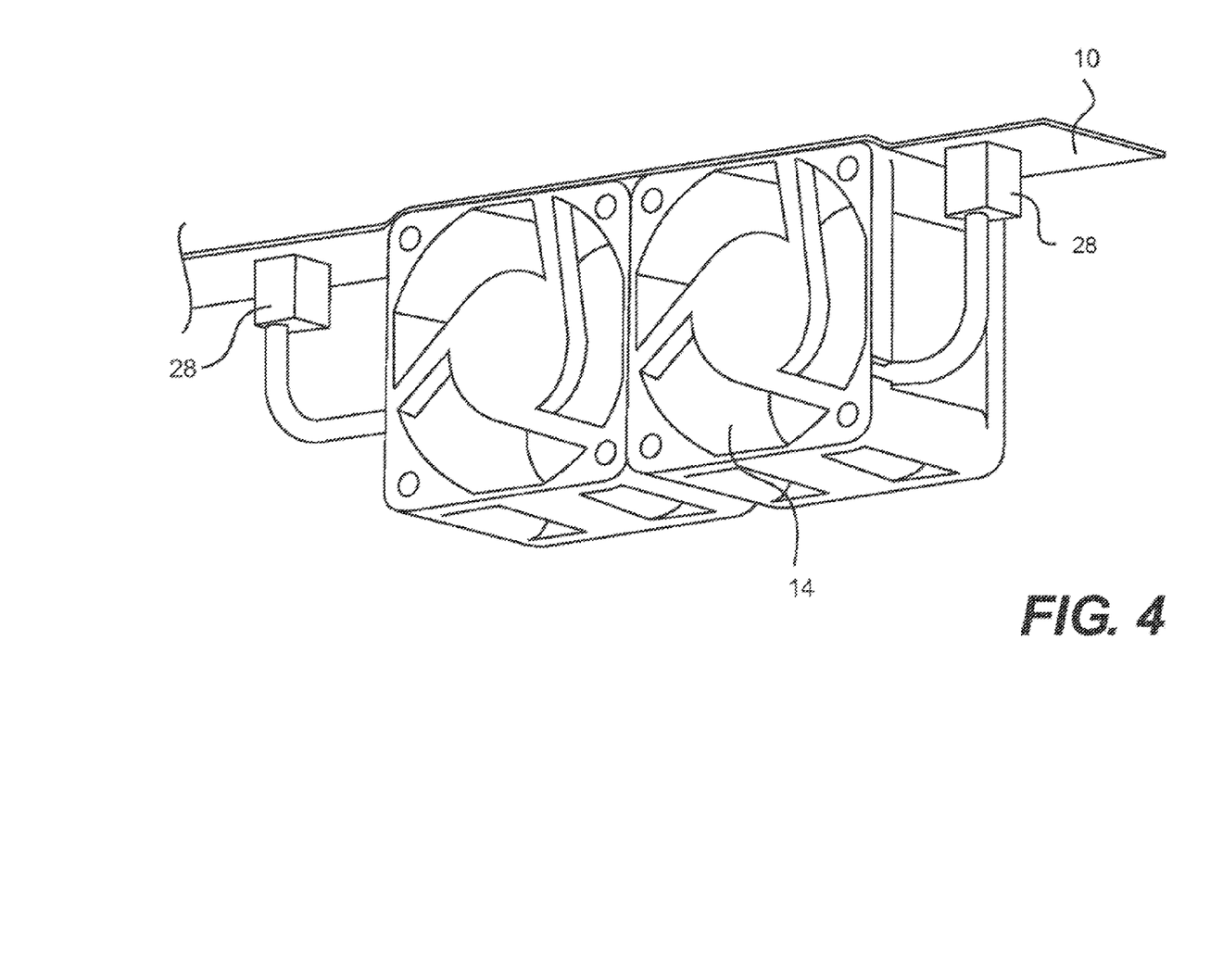
FIG. 4 is a side perspective view of an example of fan units electrically connected to a flex printed circuit board, according to at least one embodiment of the present disclosure.

FIG. 4 depicts two fan assemblies 14 having electrical connectors 28 connecting to the first portion 10 of the flex PCB. By providing the electrical connection between the first portion 10 of the flex PCB and the fan units 14, power may be supplied to the fan units through the electrical connection. In addition, other control information may be provide to the fan units from the PCA on the second portion 22 of the flex PCB, through the connection between the fan assembly and the main PCA inside the chassis, etc.

Connectors 28 may be implemented as, for example, four-pin surface mount connections, or any other suitable connection to provide power and control information to the fan units.

LED's 16, 18, as depicted in FIG. 1 may be implemented as the same four-pin surface mount connections, or other suitable connections to provide power to the LED's 16, 18.

Figure 5:
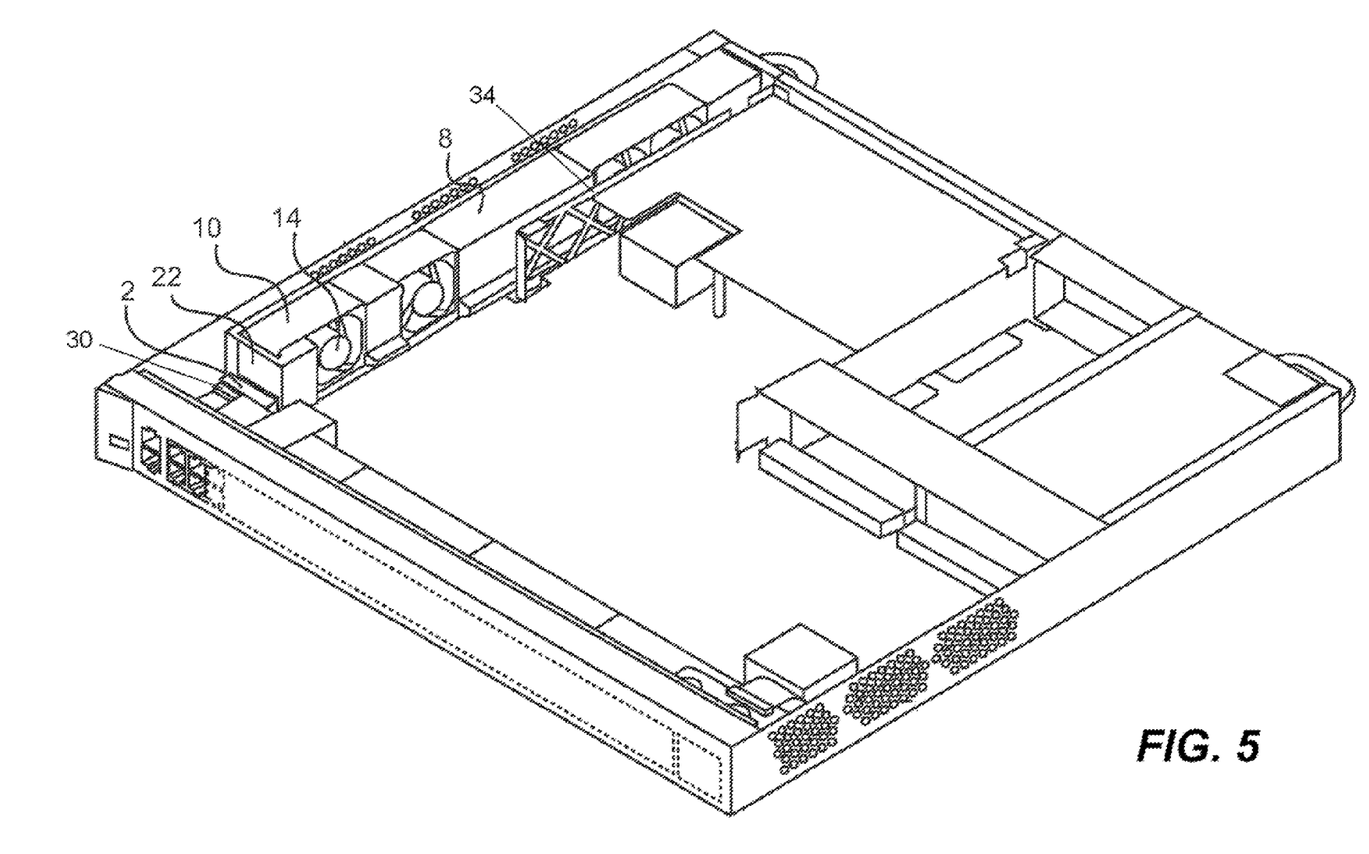
FIG. 5 is a perspective view of an example of a fan assembly disposed within a chassis, according at least one embodiment of the present disclosure.

FIG. 5 depicts a chassis of an electronic device having the fan assembly mounted therein. As can be seen in FIG. 5, connector 2 of the fan assembly is connected to a corresponding connector 30 mounted on a main PCA of the electronic device. The fan assembly may be inserted through a front side of the electronic device. A guide 34 within the chassis may assist in guiding the fan assembly as it is being inserted into the chassis such that connector 2, for example a blind mate connector, of the fan assembly may engage with the connector 30 mounted on the main PCA of the electronic device.

By providing for a fan assembly having a flex PCB to power and control the fan units as discussed above, the fan assembly may be configured such that the assembly is no larger than the size of the fan unit thereby maximizing the space allotted inside the chassis for the fan assembly. In addition, by providing for the electrical connections between the fan units and the flex PCB, the air flow created by the fan units are not obstructed by any cabling of the fan units.

We claim:

1. A fan assembly, comprising:
   a housing;
   a plurality of identical fan units slidably mounted in the housing, each of the plurality of fan units having a power connector; and
   a flex printed circuit board (PCB) having a first portion and second portion, wherein
      the first portion of the flex PCB is arranged parallel to a surface of the housing and includes a plurality of connectors to connect to corresponding connectors on each of the plurality of fan units; and
      the second portion of the flex PCB arranged orthogonal to the first portion of the flex PCB and includes a printed circuit assembly, the printed circuit assembly having mounted thereon a connector to connect to a main printed circuit assembly within a chassis.

2. The fan assembly of claim 1, wherein the height of the fan assembly is equal to the height of each of the fan units.

3. The fan assembly of claim 1, wherein the flex PCB is affixed to the surface of the housing.

4. The fan assembly of claim 1, wherein the plurality of connectors of the first portion of the flex PCB are four-pin surface mount electrical connectors.

5. The fan assembly of claim 1, wherein the printed circuit assembly of the second portion of the flex PCB is moveably restricted within a retainer portion of the housing.

6. The fan assembly of claim 1, wherein the apparatus includes four identical fan units.

7. The fan assembly of claim 1, wherein, when connected to the main printed circuit assembly within the chassis, the connection is a blind mate connection.

8. The fan assembly of claim 1, wherein the housing includes, for each identical fan unit, a retainer to maintain a position of the fan unit when mounted.

9. The fan assembly of claim 1, wherein a part of the first portion of the flex PCB is disposed within the housing, and another part of the first portion of the flex PCB is disposed outside the housing.

10. An apparatus comprising:
    a chassis having a printed circuit assembly disposed inside the chassis; and
    a fan assembly, the fan assembly comprising:
       a housing;
       a plurality of fan units mounted in the housing; and
       a flex printed circuit board (PCB) having a first portion, the first portion of the flex PCB being arranged parallel to a surface of the housing and being electrically connected to each of the plurality of fan units, the flex PCB having a second portion, the second portion of the flex PCB including a printed circuit assembly, the printed circuit assembly having mounted thereon a connector connected to the printed circuit assembly disposed within the chassis.

11. The apparatus of claim 10, wherein the flex PCB is a multilayer, copper PCB, the second portion of the flex PCB being a rigid flex portion being the printed circuit assembly.

12. The apparatus of claim 10, wherein the printed circuit assembly of the second portion of the flex PCB has mounted thereon a controller to control each of the plurality of fan units.

13. The apparatus of claim 10, wherein the fan assembly is a hot swappable fan assembly that can be replaced with a second fan assembly without interruption to the function of an electrical component within the chassis.

14. The apparatus of claim 10, wherein each of the fan units are identical 40 mm fan units, and wherein the height of the apparatus is 40 mm.

15. A fan assembly, comprising
- a housing;
- a plurality of fan units mounted in the housing; and
- a flex printed circuit board (PCB) having a first portion, the first portion of the flex PCB electrically connected to each of the plurality of fan units, the flex PCB having a second portion, the second portion of the flex PCB including a printed circuit assembly, the printed circuit assembly having mounted thereon a connector to connect to a printed circuit assembly disposed within a chassis.

16. The fan assembly of claim 15, wherein the printed circuit assembly of the second portion of the flex PCB has mounted thereon a controller to control each of the plurality of fan units.

17. The fan assembly of claim 15, wherein each of the fan units are identical 40 mm fan units, and wherein the height of the fan assembly is 40 mm.

18. The fan assembly of claim 15, wherein the printed circuit assembly of the second portion of the flex PCB is moveably restricted within a retainer portion of the housing.

19. The fan assembly of claim 15, wherein the flex PCB is copper and is affixed to the surface of the housing.

20. The fan assembly of claim 15, wherein the first portion of the flex PCB is arranged parallel to a surface of the housing and includes a plurality of connectors to connect to corresponding connectors on each of the plurality of fan units, theplurality of connectors being four-pin electrical connectors.

* * * * *

UNITED STATES PATENT AND TRADEMARK OFFICE
CERTIFICATE OF CORRECTION

| | |
|---|---|
| PATENT NO. | : 8,508,941 B2 |
| APPLICATION NO. | : 13/172982 |
| DATED | : August 13, 2013 |
| INVENTOR(S) | : Glenn C Simon et al. |

Page 1 of 1

It is certified that error appears in the above-identified patent and that said Letters Patent is hereby corrected as shown below:

In the Claims

In column 5, line 31, in Claim 20, delete "theplurality" and insert -- the plurality --, therefor.

Signed and Sealed this
Twelfth Day of November, 2013

Teresa Stanek Rea
*Deputy Director of the United States Patent and Trademark Office*